(12) United States Patent
Kasat et al.

(10) Patent No.: US 10,180,850 B1
(45) Date of Patent: Jan. 15, 2019

(54) EMULATING APPLICATIONS THAT USE HARDWARE ACCELERATION

(71) Applicant: Xilinx, Inc., San Jose, CA (US)

(72) Inventors: Amit Kasat, Hyderabad (IN); Nikhil A. Dhume, Hyderabad (IN); Sahil Goyal, Hyderabad (IN); Ch Vamshi Krishna, Hyderabad (IN)

(73) Assignee: XILINX, INC., San Jose, CA (US)

( * ) Notice: Subject to any disclaimer, the term of this patent is extended or adjusted under 35 U.S.C. 154(b) by 594 days.

(21) Appl. No.: 14/931,071

(22) Filed: Nov. 3, 2015

(51) Int. Cl.
G06F 17/50 (2006.01)
G06F 7/62 (2006.01)
G06F 9/455 (2018.01)

(52) U.S. Cl.
CPC .......... G06F 9/455 (2013.01); G06F 17/5022 (2013.01); *G06F 17/505* (2013.01); *G06F 17/5045* (2013.01)

(58) Field of Classification Search
CPC .............. G06F 17/5045; G06F 17/505; G06F 17/5022; G06F 17/5054
See application file for complete search history.

(56) References Cited

U.S. PATENT DOCUMENTS

| | | | |
|---|---|---|---|
| 6,625,797 | B1 | 9/2003 | Edwards et al. |
| 9,619,601 | B1 | 4/2017 | Villarreal et al. |
| 2010/0131933 | A1* | 5/2010 | Kim .................... G06F 8/447 717/137 |

OTHER PUBLICATIONS

Papakonstantinou, "FCUDA: Enabling Efficient Compilation of CUDA Kernels onto FPGAs", Computer Science Dept., University of California, Los-Angeles, CA, USA, 2009.*
Van Eijndhover, J.T.J. et al., "A Data Flow Graph Exchange Standard," Proc. of 3rd Eueoperan Conference on Design Automation, Mar. 16, 1992, pp. 193-199, IEEE, Piscataway, New Jersey, USA.
CA Technologies, "CA LISA® Service Virtualization," CA Technologies Data Sheet, copyright 2013, 2 pg., CA Technologies, New York, New York, USA.
Specification and drawings for U.S. Appl. No. 13/944,820, filed Jul. 17, 2013, Dhume.

* cited by examiner

*Primary Examiner* — David Silver
(74) *Attorney, Agent, or Firm* — Kevin T. Cuenot

(57) ABSTRACT

Emulating a heterogeneous application having a kernel designated for hardware acceleration may include compiling, using a processor, host program code into a host binary configured to execute in a first process of a computing system and generating, using the processor, a device program binary implementing a register transfer level simulator using the kernel. The device program binary may be configured to execute in a second, different process of the computing system. A high level programming language model of static circuitry of a programmable integrated circuit that couples to a circuit implementation of the kernel may be compiled into a static circuitry binary. The static circuitry binary may be used by the register transfer level simulator during emulation.

20 Claims, 6 Drawing Sheets

EMULATING APPLICATIONS THAT USE HARDWARE ACCELERATION

TECHNICAL FIELD

This disclosure relates to emulating applications that use hardware acceleration.

BACKGROUND

A heterogeneous application is an application that may execute on a heterogeneous computing platform. A heterogeneous computing platform refers to a data processing system that includes more than one type of processor. Typically, each different type of processor uses a different instruction set. An application written in Open Computing Language (OpenCL) is one example of a heterogeneous application. Different portions of the heterogeneous application may be designated to execute on different processors of the heterogeneous computing platform.

In some cases, one or more portions of the heterogeneous application may be designated for hardware acceleration. Hardware acceleration refers to implementing the functionality of a portion of program code in hardware or circuitry. A hardware accelerator is a circuit implementation of computer readable program instructions (e.g., program code). A hardware accelerator is functionally equivalent to the program code being hardware accelerated. Thus, rather than execute program code on a processor to perform a given task, the task may be performed by the hardware accelerator. In many cases, the hardware accelerator is able to perform tasks faster and using less power than a processor performing the same tasks by executing program code.

Often, a developer may wish to verify functionality and determine performance of hardware accelerated program code without having to undertake a lengthy and complex hardware implementation process involving synthesis, placement, and routing. In other cases, the developer may not have access to the hardware accelerator device being used for hardware acceleration, but still need to verify functionality and performance.

SUMMARY

A method of emulating an application having a kernel designated for hardware acceleration may include compiling, using a processor, host program code into a host binary configured to execute in a first process of a computing system and generating, using the processor, a device program binary implementing a register transfer level (RTL) simulator using the kernel. The device program binary may be configured to execute in a second, different process of the computing system. A high level programming language (HLL) model of static circuitry of a programmable integrated circuit (IC) that couples to a circuit implementation of the kernel may be compiled into a static circuitry binary. The static circuitry binary may be used by the RTL simulator during emulation.

A system for emulating an application having a kernel designated for hardware acceleration may include a processor programmed to initiate executable operations. The executable operations may include compiling host program code into a host binary configured to execute in a first process of a computing system and generating, using the processor, a device program binary implementing a register transfer level (RTL) simulator using the kernel. The device program binary may be configured to execute in a second, different process of the computing system. An (HLL) model of static circuitry of a programmable IC that couples to a circuit implementation of the kernel may be compiled into a static circuitry binary. The static circuitry binary may be used by the RTL simulator during emulation.

A method of emulating a heterogeneous application with hardware accelerated program code may include executing, using a processor of a computing system, a host binary within a first process of the computing system and, responsive to determining that a first device program binary is configured for emulating hardware acceleration of a first kernel, loading, using the processor, a first emulation driver. In a second and different process of the computing system, the first device program binary for the first kernel may be executed. The first device program binary may implement a first RTL simulator for the first kernel. The host binary may communicate with the first RTL simulator through the first emulation driver using inter-process communication.

A system for emulating a heterogeneous application with hardware accelerated program code may include a processor configured to initiate executable operations. The executable operations may include executing a host binary within a first process of the system and, responsive to determining that a first device program binary is configured for emulating hardware acceleration of a first kernel, loading a first emulation driver. In a second and different process of the system, the first device program binary for the first kernel may be executed. The first device program binary may implement a first RTL simulator for the first kernel. The host binary may communicate with the first RTL simulator through the first emulation driver using inter-process communication.

A non-transitory computer-readable medium has instructions stored thereon which, when executed by a processor, may perform the various methods described within this disclosure.

This Summary section is provided merely to introduce certain concepts and not to identify any key or essential features of the claimed subject matter. Other features of the inventive arrangements will be apparent from the accompanying drawings and from the following detailed description.

BRIEF DESCRIPTION OF THE DRAWINGS

The inventive arrangements are illustrated by way of example in the accompanying drawings. The drawings, however, should not be construed to be limiting of the inventive arrangements to only the particular implementations shown. Various aspects and advantages will become apparent upon review of the following detailed description and upon reference to the drawings.

DETAILED DESCRIPTION

Figure 1:
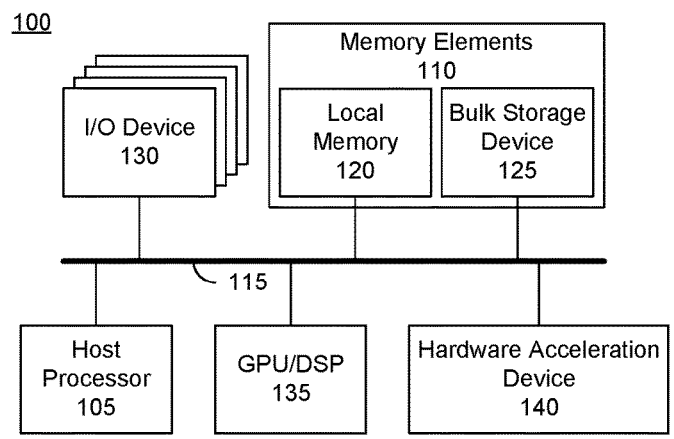
FIG. 1 is an exemplary architecture for a heterogeneous computing platform including a hardware acceleration device.

While the disclosure concludes with claims defining novel features, it is believed that the various features described within this disclosure will be better understood from a consideration of the description in conjunction with the drawings. The process(es), machine(s), manufacture(s), and any variations thereof described herein are provided for purposes of illustration. Specific structural and functional details described within this disclosure are not to be interpreted as limiting, but merely as a basis for the claims and as a representative basis for teaching one skilled in the art to variously employ the features described in virtually any appropriately detailed structure. Further, the terms and phrases used within this disclosure are not intended to be limiting, but rather to provide an understandable description of the features described.

This disclosure relates to emulating applications that use hardware acceleration. In accordance with the inventive arrangements disclosed herein, applications that use programmable integrated circuits (ICs) for hardware acceleration may be emulated. An application may include program code designated for execution by a processor and program code that may be designated for hardware acceleration. An OpenCL application, for example, may include host program code that is to be executed by a host processor and one or more kernels. Program code of the OpenCL application called kernels may be executed by one or more different processors and/or designated for hardware acceleration using a programmable IC.

Execution of an application that includes program code designated for hardware acceleration may be emulated. As defined herein, the term "emulate" or "emulating" means mimicking or imitating operation of an application and, in particular, a hardware accelerated portion of the application, using a processor or processors of a data processing system through execution of emulation program code. For example, an OpenCL application having a hardware accelerated kernel may be emulated using a computer system without any hardware acceleration device coupled thereto to implement the hardware accelerated kernel. A hardware acceleration device generally refers to hardware such as a programmable IC and/or a circuit board that implements program code (e.g., a kernel) in circuitry. The hardware acceleration device is coupled to a host processor executing host program code.

In one arrangement, the host program code may be compiled into a host binary without modification for emulation. The host binary may be executed in a first process of a data processing system. A model of a hardware acceleration device may be generated as a device program binary and executed in a second, different process of the data processing system, i.e., the same data processing system. The device program binary may reference or use a compiled, high level programming language (HLL) model of static circuitry within the programmable IC. The device program binary may implement a register transfer level (RTL) simulator for the program code designated for hardware acceleration. The RTL simulator is configured to call or invoke the compiled HLL models of the static circuitry. Further details for emulating an application that uses hardware acceleration are described in greater detail within this disclosure.

The inventive arrangements described herein may be implemented as a method or process performed by a data processing system for emulating an application that uses hardware acceleration. The inventive arrangements may be implemented as a data processing system having a processor. The processor, upon executing program code, may emulate an application that uses hardware acceleration. The inventive arrangements may be implemented as a non-transitory computer-readable storage medium storing program code that, when executed, causes a processor and/or a system to perform and/or initiate a method or process for emulation of an application that uses hardware acceleration.

For purposes of simplicity and clarity of illustration, elements shown in the figures have not necessarily been drawn to scale. For example, the dimensions of some of the elements may be exaggerated relative to other elements for clarity. Further, where considered appropriate, reference numbers are repeated among the figures to indicate corresponding, analogous, or like features.

FIG. 1 is an exemplary architecture 100 for a heterogeneous computing platform. A heterogeneous computing platform refers to a data processing system that uses two or more different computing platforms where at least one computing platform utilizes an instruction set that is different from at least one other computing platform. Exemplary heterogeneous computing platforms may include a CPU and a graphics processing unit (GPU); a CPU and digital signal processor (DSP); a CPU, a GPU, and a DSP; or the like. Other examples of heterogeneous computing platforms may include one or more of a CPU, a GPU, a DSP, or other processor that is configured to execute program code in combination with one or more hardware accelerator devices that may be used to implement program code as circuitry. One example of a hardware accelerator device is a programmable IC such as a field programmable gate array (FPGA).

As pictured, architecture 100 may include a host processor 105 (host). Host 105 may be implemented as a CPU. Host 105 may be coupled to memory elements 110 through a system bus 115 or other suitable circuitry. Architecture 100 stores program code within memory elements 110. Memory elements 110 may include one or more physical memory devices such as, for example, a local memory 120 and one or more bulk storage devices 125. Local memory 120 refers to random access memory (RAM) or other non-persistent memory device(s) generally used during actual execution of the program code. Bulk storage device 125 may be implemented as a hard disk drive (HDD), solid state drive (SSD), or other persistent data storage device. Architecture 100 may also include one or more cache memories (not shown) that provide temporary storage of at least some program code in order to reduce the number of times program code must be retrieved from bulk storage device 125 during execution.

Architecture 100 may be coupled to one or more input/output (I/O) devices 130. Exemplary I/O devices may include, but are not limited to, a keyboard, a display device, a pointing device, and/or one or more network adapters. For ease of illustration, an operating system and applications are not illustrated. It should be appreciated that architecture 100 may execute an operating system in combination with one or more heterogeneous applications.

In the example of FIG. 1, architecture 100 may optionally include a second platform such as one or more of a GPU and/or a DSP illustrated as GPU/DSP 135. Architecture 100, as noted, further may include a hardware acceleration device 140. Hardware acceleration device 140 may include a programmable IC that may communicate with other elements of architecture 100 through system bus 115 or other circuitry. As noted, one example of a programmable IC is an FPGA.

An application configured for hardware acceleration may be stored in memory elements 110 and executed by a system using architecture 100. In one arrangement, the application may be a heterogeneous application. An example of a heterogeneous application is an OpenCL application. OpenCL stands for "Open Computing Language" and is a framework for writing computer programs that may execute across heterogeneous computing platforms. When compiled, an OpenCL application may include executable program code that is executed by host 105. The OpenCL application may also include executable program code that may be referred to as a kernel. The OpenCL application may include one or more kernels that may be offloaded from host 105 to one or more of the other processors, e.g., GPU/DSP 135, for execution, thereby increasing overall execution speed and efficiency.

The OpenCL application further may include one or more kernels that may be hardware accelerated and implemented as circuitry within the programmable IC of hardware acceleration device 140. Kernels implemented as circuitry are said to be "hardware accelerated" and may be referred to as "hardware accelerators." For example, a configuration bitstream specifying a hardware accelerated version of a kernel may be stored in memory elements 110 as a binary file that may be loaded into the programmable IC of hardware acceleration device 140 to implement the kernel in circuitry. The circuitry of the programmable IC may implement a kernel that operates faster and with greater efficiency than had the kernel been executed as program code by GPU/DSP 135.

In developing an application that uses hardware acceleration, a developer may not have access to hardware acceleration device 140. In other cases, the developer may not have time to continually implement each variation of the program code designated for hardware acceleration in hardware for evaluation and/or testing. Implementation of program code in hardware may be time consuming and typically requires translation of the HLL program code to be hardware accelerated to an RTL equivalent, synthesis, placement, routing, and configuration bitstream generation. Accordingly, emulation of the application, including those portions designated for hardware acceleration, entirely within a computer without the aid of a hardware acceleration device is often desirable.

For purposes of description and ease of illustration, OpenCL terminology is used throughout this application. It should be appreciated, however, that any of a variety of different applications written in an HLL may be hardware accelerated. In this regard, within this disclosure, the term "host program code" may refer to program code that is not accelerated. For example, "host program code" may refer to program code intended to be executed by a CPU or a host such as host 105. The term "kernel" or "kernel program code" may refer to program code not intended to execute on the host and that may be hardware accelerated regardless of whether the program code is part of an OpenCL framework or application.

Figure 2:
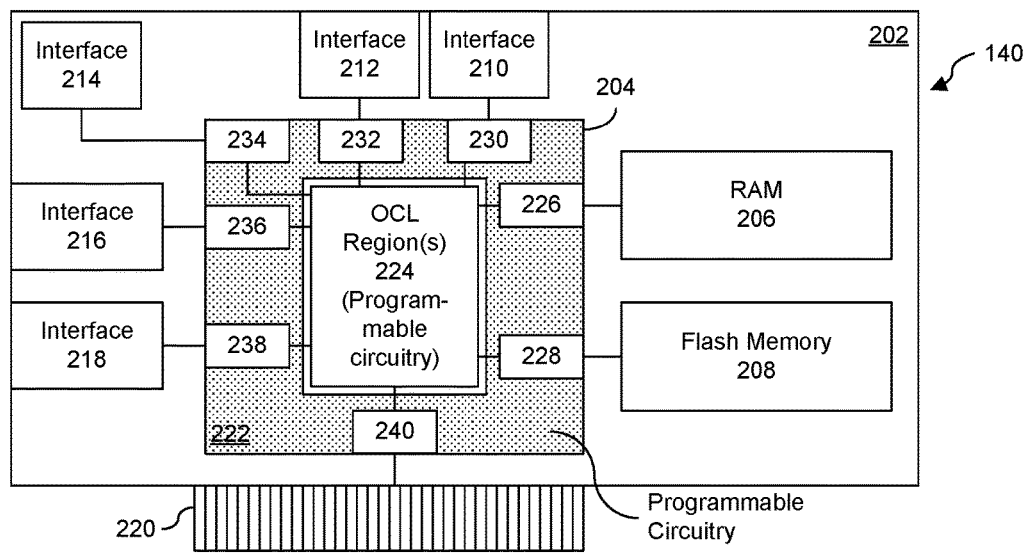
FIG. 2 is a block diagram illustrating an exemplary implementation of the hardware acceleration device of FIG. 1.

FIG. 2 is a block diagram illustrating an exemplary implementation of hardware acceleration device 140. Hardware acceleration device 140 may include a circuit board 202. Circuit board 202 may include a plurality of components such as a programmable IC 204, RAM 206, flash memory 208, and one or more interfaces 210, 212, 214, 216, and 218.

RAM 206 may be implemented as one or more RAM circuit modules coupled to programmable IC 204. Flash memory 208 may be implemented as one or more flash memory circuit modules coupled to programmable IC 204. Each of interfaces 210, 212, 214, 216, and 218 may be implemented as circuitry and/or a physical connector that is coupled to programmable IC 204 through circuitry on circuit board 202.

In one aspect, interfaces 216 and 218 each may be implemented as a 10 gigabit Ethernet interface that allows hardware acceleration device 140 to couple to one or more other systems. Interfaces 210 and 212 may be implemented as Serial Advanced Technology Attachment (SATA) interfaces that allow hardware acceleration device 140 to couple to one or more other systems. Interface 214 may be implemented as a Joint Test Action Group (JTAG) interface.

In the example of FIG. 2, circuit board 202 may be implemented with a form factor of a card that may plug, or be inserted, into a Peripheral Component Interconnect (PCI) Express serial bus card slot. As such, hardware acceleration device 140 may include a card edge connector 220. Card edge connector 220 may be coupled to programmable IC 204 through circuitry on circuit board 202. Programmable IC 204 may communicate with host 105 and/or another processor (e.g., GPU/DSP 135) through communication bus 115 by way of card edge connector 220.

In one arrangement, programmable IC 204 may be implemented as an FPGA. As pictured, programmable IC 204 may include static circuitry 222 and one or more Open CL (OCL) regions 224. Static circuitry 222 is indicated with shading. The various circuit blocks within the shaded portion of programmable IC 204 are part of static circuitry 222. For example, static circuitry 222 may include a RAM interface circuit 226 (e.g., a RAM memory controller), a flash interface circuit 228 (e.g., a flash memory controller), and interface circuits 230, 232, 234, 238, and 240. OCL regions 224 are not part of, or included within, static circuitry 222. For purposes of illustration, interface circuits 230 and 232 may be SATA interface circuits. Interface circuits 236 and 238 may be 10 gigabit Ethernet interface circuits. Interface circuit 240 may be a PCIe interface circuit. Interface circuit 234 may be a JTAG circuit or port.

In one arrangement, static circuitry 222 may be implemented by loading a static circuit design, e.g., a configuration bitstream, into configuration memory of programmable IC 204. In one aspect, the configuration bitstream specifying static circuitry 222 may be a full configuration bitstream. In another aspect, the configuration bitstream specifying static circuitry 222 may be a partial configuration bitstream. Static circuitry 222, and as such, the static circuit design specifying static circuitry 222, may be implemented as a static region in terms of performing dynamic partial reconfiguration.

OCL region(s) 224 represent the area of programmable IC 204 in which hardware accelerators, e.g., hardware accelerated kernels, may be implemented as circuitry. OCL region(s) 224, for example, may be implemented as dynamically reconfigurable regions. In general, dynamic partial reconfiguration is the ability to dynamically modify blocks of programmable circuitry of a programmable IC such as OCL region 224 by downloading partial configuration bitstreams (e.g., partial bit files) while the remaining circuitry such as static circuitry 222 continues to operate without interruption. As such, one or more partial configuration bitstreams may be loaded into programmable IC 204 to implement static circuitry 222 and/or one or more hardware accelerators (e.g., kernels designated for hardware acceleration) in OCL region(s) 224.

In one arrangement, static circuitry 222 provides interface circuitry for hardware accelerated kernels implemented in OCL regions 224. Static circuitry 222 may be considered unchanging. The circuitry implemented in OCL regions 224 is not static. More particularly, circuitry in OCL regions 224 is derived from user designs, i.e., program code of a user application that is to be hardware accelerated, and, as such, changes from one application to another. Static circuitry 222 may remain unchanged regardless of the kernels that are hardware accelerated in OCL regions 224. It should be appreciated, however, that both static circuitry 222 and OCL regions 224 may be implemented using programmable circuitry of programmable IC 204. Static circuitry 222 does not change with different user kernel designs as does OCL regions 224.

FIGS. 1 and 2 are presented to illustrate aspects of hardware that may be emulated. In one arrangement, the entirety of hardware accelerator device 140 may be emulated as a device program binary to be described herein in greater detail. The device program binary may emulate operation of circuitry of circuit board 202, static circuitry of programmable IC 204, and/or OCL regions 224.

Figure 3:
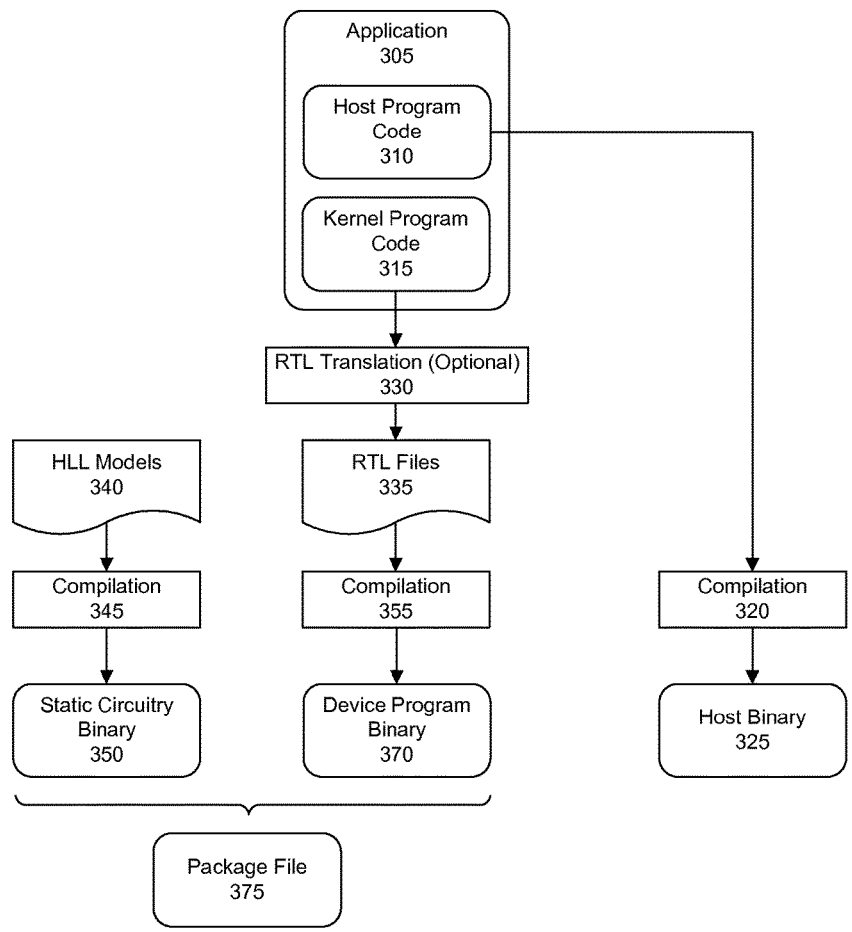
FIG. 3 is a block flow diagram illustrating an exemplary method of emulating an application that uses hardware acceleration.

FIG. 3 is a block flow diagram illustrating an exemplary method of emulating an application that uses hardware acceleration. FIG. 3 illustrates "compile time" operations that generate the executable program code used to emulate execution of an application that uses hardware acceleration. The various operations described with reference to FIG. 3 may be performed by a data processing system. The data processing system (system) used to perform the operations illustrated in FIG. 3 may or may not be the same system used to subsequently emulate execution of the application.

Application 305 may include different portions of program code. In one example, application 305 is an OpenCL application. In another example, application 305 may be written in an HLL or in two or more different HLLs. As pictured, application 305 may include host program code 310 and kernel program code 315. Kernel program code 315 may include one or more kernels that are designated for hardware acceleration.

Host program code 310 may undergo compilation 320 as performed by a system executing a compiler. In one aspect, host program code may be compiled without any modification to the compilation process for purposes of emulation. For example, host program code 310 may be compiled as is normally the case for execution on a host. Accordingly, compilation 320 may generate a host binary 325. Host binary 325 may be an executable version of host program code 310.

Kernel program code 315, which represents the kernels to be hardware accelerated, optionally may undergo RTL translation 330 to generate one or more RTL files 335. For example, initially, kernel program code 315 may be specified in an HLL. RTL translation 330 may be performed by the system executing suitable software, e.g., an electronic design automation (EDA) application or other hardware compilation software. The system that performs RTL translation 330 may be a different system than used to perform compilation 320. As noted, RTL translation 330 presumes that kernel program code 315 is originally specified in an HLL. It should be appreciated, however, that in other arrangements, kernel program code 315 may be specified in RTL. In that case, RTL translation 330 need not be performed.

As pictured, HLL models 340 may undergo compilation 345. HLL models 340 are HLL models of the static circuitry of the programmable IC described with reference to FIG. 2. As noted, the static circuitry may remain constant despite the ability to accommodate changing hardware accelerators. Accordingly, HLL models 340 may be created for the static circuitry. HLL models 340 may undergo compilation 345 as performed by the system executing a compiler. The system responsible for compilation 345 may be different than the system performing compilation 320 and/or compilation 355. Compilation 345 generates a static circuitry binary 350. Static circuitry binary 350 may be implemented as executable program code.

RTL files 335 may undergo compilation 355. In one arrangement, compilation 355 may generate a device program binary 370. Device program binary 370 may be executable program code. In one aspect, device program binary 370 may be implemented as an RTL simulator for kernel program code 315 and/or RTL files 335. The RTL simulator is executable program code. Since device program binary 370 is a binary file, device program 370 may be handled by a host. The system responsible for compilation 355 may be different than the system used for compilation 320. Within this disclosure, the terms "RTL simulator" and "device program binary" may be used interchangeably from time to time.

In an arrangement, the RTL simulator implemented as device program binary 370 may be linked with static circuitry binary 350. Static circuitry binary 350 may be implemented as one or more shared objects. For example, static circuitry binary 350 may be implemented as dynamic link libraries. Dynamic link libraries may have extensions such as *.so, *.dll, or the like. Accordingly, device program binary 370, e.g., the RTL simulator, when executed for performing emulation, may call or invoke one or more functions of static circuitry binary 350. Static circuitry binary 350 may execute in a same process as device program binary 370. Host binary 325 and device program binary 370 may execute in different processes of the system used to perform emulation.

The inventive arrangements described herein allow emulation to be performed with increased speed. RTL emulation of real hardware is often slow and unusable for software development purposes. By using a hybrid emulation infrastructure that uses static circuitry binary 350 for emulating operation of the static circuitry and device program binary 370 for emulating the dynamic portion (kernel specific) of the application, faster and more efficient emulation may be performed.

In another arrangement, static circuitry binary 350 and device program binary 370 may be combined into package file 375. For example, package file 375 may be a zip or other compressed file format or container that allows two or more files to be combined.

Figure 4:
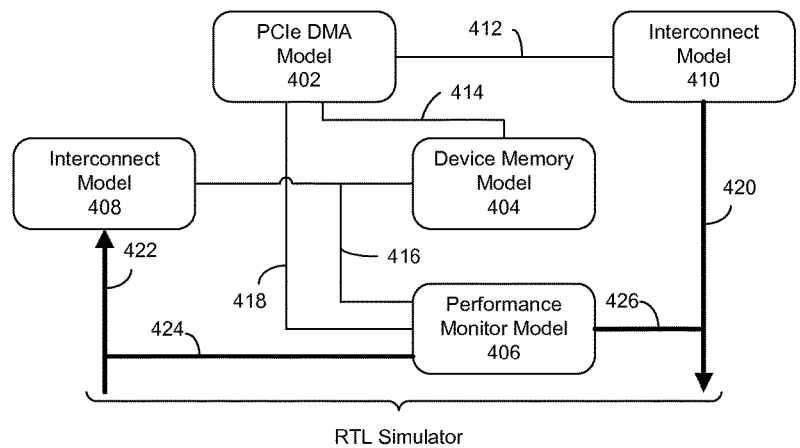
FIG. 4 is a block diagram illustrating an exemplary architecture defined by high level programming language (HLL) models for static circuitry of a programmable integrated circuit (IC).

FIG. 4 is a block diagram illustrating an exemplary architecture defined by HLL models for the static circuitry. FIG. 4 illustrates an exemplary architecture that HLL models 340 may specify. As pictured, the architecture may include a PCIe direct memory access (DMA) model 402, a device memory model 404, and a performance monitor model 406. Interconnect models 410 may also be included. Within FIG. 4, thin lines such as lines 412, 414, 416, and 418 represent the exchange of data, during emulation, using HLL transactions. Bold lines such as lines 420, 422, 424, and 426 may represent the exchange of data as RTL signals. RTL signals are pin level signals as specified in an RTL description of circuitry.

As defined herein, an "HLL transaction" is the passing of data (e.g., signals), formatted as arguments and/or data types including data structures that may be passed from one function to another and/or used within HLL program code. For example, an HLL transaction may be a C and/or C++ transaction where arguments having a defined C and/or C++ data type may be passed from one function to another.

In one arrangement, PCIe DMA model 402 may be configured to emulate operation of interface 240 of programmable IC 204. In another arrangement, PCIe DMA model 402 may be configured to emulate operation of interface 240, connector 220, and/or any circuitry of circuit board 202 coupling interface 240 and connector 220. Device memory model 404, for example, may emulate operation of interface circuit 226 (e.g., a DDR memory controller) and RAM 206. Interconnect models 408 and 410 may emulate operation of interconnect circuitry. For example, interconnect models 408 and/or 410 may emulate operation of AXI interconnect circuitry on programmable IC 204.

Performance monitor model 406 may be configured to emulate operation of an interconnect performance monitor. For example, performance monitor model 406 may emulate operation of an AXI performance monitor (APM) circuit block. Performance monitor model 406 may be configured to measure or count the number of transactions that occur during emulation, latencies, bandwidth, etc. on the monitored interfaces. In an arrangement, performance monitor model 406 may be configured to monitor communications between two or more models of circuit blocks (e.g., two IPs or cores) and/or communications with a memory model. Performance monitor model 406 may further monitor the RTL signals of the RTL simulator, e.g., as represented by lines 424 and 426. Performance monitor model 406 may determine how many read and/or write transactions have occurred, how long the transactions took, when the transactions started and/or stopped, etc.

During emulation, performance monitor model 406 may store information about various statistics within an internal data structure. In one arrangement, an emulation driver (used by the host binary to communicate with the device program binary) may use a callback function to read performance statistics from the device program binary using inter-process communication (IPC) established at runtime of the device program binary. During emulation, the host binary and/or emulation driver may use IPC to directly access the gathered profiling information from performance monitor model 406 through function calls as opposed to executing interconnect, e.g., AXI, transactions to read back data. As such, emulation is largely non-intrusive in relation to communicating performance statistics between the host binary and the device program binary. In a further aspect, an OpenCL runtime executing in a same process as the host binary may be programmed to call or poll profiling and/or trace application programming interfaces (APIs) of the emulation driver at regular intervals to access performance monitor model 406.

PCIe DMA model 402 may communicate with interconnect model 410 as illustrated by line 412, device memory model 404 as illustrated by line 414, and performance monitor 406 as illustrated by line 418. Line 412, for example, may represent HLL transactions emulating operation of an OCL_CTRL port carrying communications from PCIe DMA model 402 to interconnect model 410. Line 414 may represent HLL transactions emulating memory transactions such as reads and writes between PCIe DMA model 402 and device memory 404. Line 418 may represent HLL transactions emulating operation of transaction level monitoring performed by performance monitor model 406.

Interconnect model 410 may be configured to translate HLL transactions received from PCIe DMA model 402 into RTL signals represented by line 420. RTL signals represented by line 420 may be provided to the RTL simulator representing the OCL region of the programmable IC during emulation. Interconnect model 408 may be configured to receive RTL signals represented by line 422 from the RTL simulator and translate the RTL signals to HLL transactions that may be output to device memory model 404 as represented by line 416.

For purposes of illustration, consider the case of an x86 based host and PCIe interface to the programmable IC. The static circuitry of the programmable IC may be emulated using HLL models as described with reference to FIG. 4. Using HLL models for the static circuitry facilitates faster, more responsive emulation. The resulting static circuitry models may interface with the RTL simulator (e.g., device program binary) using any of a variety of APIs such as, for example, SystemVerilog Direct Programming Interface (DPI), SystemC, or the like.

In another arrangement, HLL models as illustrated in FIG. 4 may be configured, prior to and/or during runtime, to operate at different levels of granularity. For example, static circuitry binary 350 as illustrated in FIG. 4 may implement untimed emulation of static circuitry, cycle approximate emulation of static circuitry, or emulation at varying levels between untimed and cycle approximate emulation.

In another aspect, one or more additional models may be included for the static circuitry. Modeling of the static circuitry may be extended to support the OpenCL IO Pipes concept which allows additional data to be provided to the hardware accelerated kernel. For example, one or more I/O models of circuit blocks such as video receiver circuits, video output circuits, Ethernet interface circuits, and the like may be added to the static circuitry models. When emulation starts, the I/O models may read and/or write to a file thereby mimicking, or emulating, data acquisition, sending, and/or streaming of data with external sources. The I/O models may inject the acquired data into the device program binary. For example, the acquired data may be provided to the RTL simulator (kernel), to the device memory model, etc.

Figure 5:
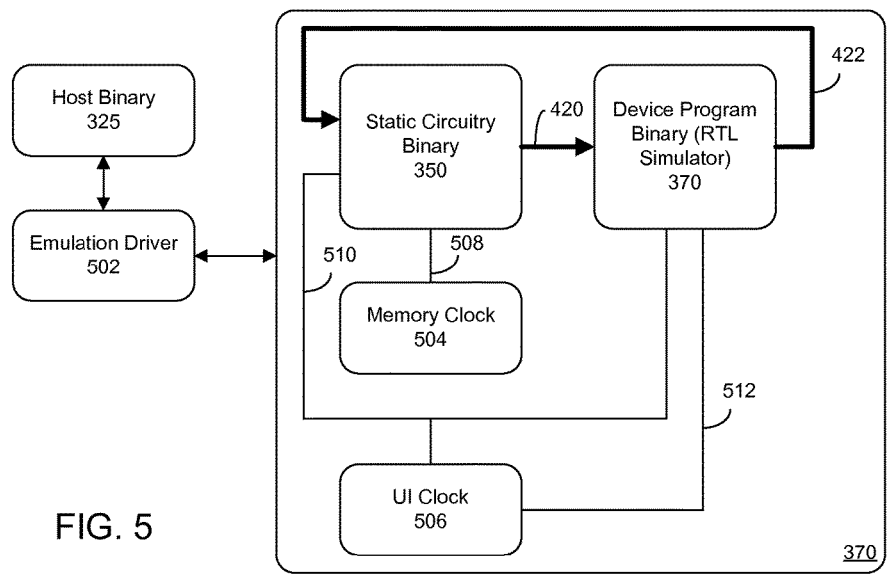
FIG. 5 is a block diagram illustrating an exemplary software architecture for emulating execution of an application that uses hardware acceleration.

FIG. 5 is a block diagram illustrating an exemplary software architecture for emulating execution of an application that uses hardware acceleration. FIG. 5 illustrates a runtime example of emulating an application that uses hardware acceleration. As pictured, host binary 325 may execute. Host binary 325 may include, or utilize, an OpenCL runtime. The OpenCL runtime may load emulation driver 502. Emulation driver 502 may execute device program binary 370 and/or static circuitry binary 350. For example, as noted, device program binary 370 may be an RTL simulator. RTL simulator, upon execution, may load various functions of static circuitry binary 350. For purposes of discussion, static circuitry binary 350 may implement the architecture described with reference to FIG. 4.

In one arrangement, emulation driver 502 may execute device program binary 370 in a different process than the process in which host binary 325 executes. For example, emulation driver 502 may fork the process of host binary 325. Thus, device program binary 370 may be implemented as a self-contained simulation model that executes in its own process independent of host binary 325. Device program binary 370 may invoke static circuitry binary 350 and the two may execute in a same process. Host binary 325 may communicate with device program binary 370 using IPC as may be implemented by emulation driver 502. IPC may be implemented using file based sockets, TCPIP sockets, or the like. In one aspect, emulation driver 502 may communicate with device program binary 370 using Hypertext Application Language (HAL) APIs.

Since host binary 325 and device program binary 370 execute in different processes, the host program code may be compiled using a different compiler than is used for the HLL models of the static circuitry. Thus, host binary 325 may be generated at one time and by one party, while device program binary 370 may be generated at a different or later time and/or by a different party. Use of different processes for execution during emulation further minimizes the memory requirements for execution of host binary 325 and aids in debugging. Process separation further protects host binary 325 from corruption from any issues relating to implementation of device program binary 370.

As pictured, static circuitry binary 350 may receive clock signals during emulation from a memory clock block 504 as represented by line 508. In one aspect, memory clock block 504 may be implemented as program code configured to provide clock signals to static circuitry models 350. A user interface (UI) clock block 506 (e.g., program code that provides clock signals) may provide clock signals represented by line 510 to static circuitry binary 350 and to device program binary 370. UI clock 506 further may provide a reset signal to device program binary 370 as represented by line 512. Memory clock 504 and UI clock 506 may be implemented independently of one another and independently of static circuitry binary 350 and device program binary 370. In another aspect, memory clock 504 and/or UI clock 506 may be incorporated into static circuitry binary 350 and/or device program binary 370.

Figure 6:
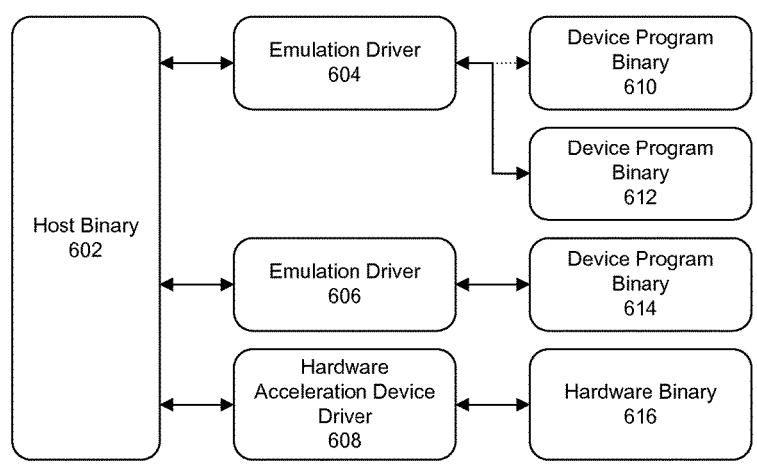
FIG. 6 is a block diagram illustrating another exemplary software architecture for emulating execution of an application that uses hardware acceleration.

FIG. 6 is a block diagram illustrating another exemplary software architecture for emulating execution of an application that uses hardware acceleration. FIG. 6 illustrates an example where a host binary 602 may interact with one or more different binaries for emulation and/or for performing actual hardware acceleration. The example of FIG. 6 illustrates that host binary 602 may interact with more than one device program binary concurrently. Further, host binary 602 may interact with one or more device program binaries concurrently with a hardware binary 616.

Each of device program binaries 610, 612, and 614 represents an executable model of a programmable IC or a hardware acceleration device having a programmable IC. Emulation driver 604 may communicate with device program binary 610 and device program binary 612 but not concurrently. Emulation driver 606 may communicate with device program binary 614. Hardware acceleration device driver 608 may communicate with hardware binary 616.

The combination of emulation driver 604, device program binary 610, and device program binary 612 illustrates one technique for emulating a hardware acceleration device where the programmable IC undergoes dynamic reconfiguration and/or partial dynamic reconfiguration. For example, the solid arrow coupling emulation driver 604 with device program binary 612 indicates that device program binary 612 is currently loaded and executing to communicate with host binary 602. The dotted line to device program binary 610 indicates that device program binary 610 is not loaded or executed while device program binary 612 is loaded and executed. Device program binary 612 represents an executable emulation of a particular configuration of the programmable IC. Device program binary 612 may represent an implementation in which the programmable IC has one or more kernels implemented within the OCL region. Device program binary 610 may represent a different implementation in which the programmable IC has one or more different kernels implemented within the OCL region.

Host binary 602 may communicate with device program binary 612 through emulation driver 604. When finished using device program binary 612, host binary 602 may instruct emulation driver to use and/or load different kernels that may be emulated by device program binary 614. In a traditional hardware acceleration, the requested operations would cause a hardware acceleration driver to initiate reconfiguration of the programmable IC to implement the necessary kernels in circuitry. In the case of FIG. 6, the instructions from host binary cause emulation driver 604 to shut down the RTL simulator of device program binary 612. Other entities such as host binary 602, emulation driver 604, emulation driver 606, hardware acceleration device driver 608, device program binary 614, and hardware binary 616 may continue to operate. Emulation driver 604 may load device program binary 610. Host binary 602 may continue execution and, once loaded, access device program binary 610 through emulation driver 604.

The unloading of device program binary 612 and subsequent loading of device program binary 610 may be conducted concurrently with continued access and operation of host binary 602, device program binary 614, and hardware binary 616. In one arrangement, emulation driver 604 may handle the loading and unloading operations responsive to instructions from host binary 602. Since host binary 602 is compiled in a standard way as if being compiled for actual execution on a heterogeneous system as opposed to emulation, the instructions from host binary 602 are standard instructions for accessing a particular kernel. For example, if the instructions from host binary 602 were executed by hardware acceleration device driver 608, hardware acceleration device driver 608 would initiate reconfiguration of the programmable IC coupled thereto. In the case of using an emulation driver, emulation driver 604 interprets the instructions from host binary 602 to unload one device program binary and load a different device program binary. Host binary 602 continues to operate as is normal and unaware of which hardware acceleration devices are emulated and which are not.

While device program binary 610 and device program binary 612 may emulate different kernel implementations, it should be appreciated that device program binary 610 and device program binary 612 may utilize same static circuitry models. In another arrangement, however, device program binary 610 and device program binary 612 may utilize different static circuitry models.

Device program binaries such as device program binary 610 and device program binary 612 that communicate using a same type of communication channel may communicate with host binary 602 using a same emulation driver, albeit in a serial manner one device program binary at a time. Since device program binary 610 and device program binary 612 represent different configurations of a same hardware acceleration device and/or programmable IC, each may emulate the same communication channel, e.g., PCIe, to communicate with host binary 602 and, therefore use the same emulation driver.

Device program binary 614 may represent an emulation of a different hardware acceleration device than is represented by either device program binary 610 or device program binary 612. In one aspect, device program binary 614 may communicate with host binary 602 using the same communication channel as is used by device program binary 610 and/or device program binary 612. In another aspect, device program binary 614 may communicate with host binary 602 through a different communication channel, e.g., a Universal Serial Bus (USB). In either case, to support concurrent operation of device program binary 614 with hardware binary 616 and one of device program binaries 610 or 612, device program binary 614 uses a different emulation driver, i.e., emulation driver 606.

As discussed, since host binary 602 is compiled in the same manner as when performing compilation for an actual, functioning system, host binary 602 further may communicate with a physical hardware acceleration device illustrated in FIG. 6 by hardware binary 616. Hardware binary 616 is a binary file that may include one or more configuration bitstreams that may be loaded into an actual programmable IC. As discussed, host binary 602 may communicate with the device program binaries 614, hardware binary 616, and one of device program binary 610 or device program binary 612 concurrently while emulating execution of the application. Each device program binary represents the emulation of an entire, different hardware acceleration device.

It should be appreciated that emulation may be performed using two or more device program binaries to emulate reconfiguration and/or partial reconfiguration of the programmable IC using the same emulation driver the device program binaries are used serially. Emulation may be performed where two or more device program binaries are used concurrently representing different hardware acceleration devices where each device program binary uses a different emulation driver. Further, emulation may be performed using a combination of program device binaries in combination and concurrently with a hardware acceleration device. In this regard, the example of FIG. 6 is not intended as a limitation.

With reference to FIG. 6, in one arrangement, each device program binary 614 and device program binary 612 may execute in different processes that are both different from the process in which host binary 602 executes. In another aspect, however, device program binary 612 and device program binary 614 may execute in a same process, but one that is still different from the process in which host binary 602 executes. Device binary 610 and device program binary 612 may execute in a same process as the two binaries are not executed concurrently. Varying degrees of isolation may be achieved between host binary 602 and device program binaries and between individual device program binaries that may operate concurrently depending upon the particular number of processes used.

Figure 7:
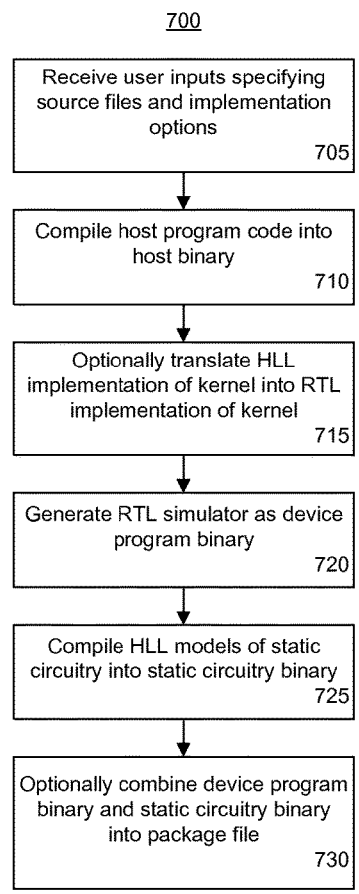
FIG. 7 is a flow chart illustrating an exemplary method of emulating an application that uses hardware acceleration.

FIG. 7 is a flow chart illustrating an exemplary method 700 of emulating an application that uses hardware acceleration. Method 700 illustrates operations that may be performed by a data processing system (system) in preparing to emulate an application that uses hardware acceleration. For example, method 700 illustrates "compile time" operations.

In block 705, the system may receive one or more user specified inputs. For example, the system may receive a user input specifying host program code of the application and one or more kernels designated for hardware acceleration. The user specified inputs further may indicate one or more implementation options. For example, the user inputs may indicate that the application and/or particular kernels of the application are to be emulated.

Further, the user inputs may select a particular hardware acceleration device, or devices as the case may be, that is to be emulated for one or more kernels. As discussed, the selection of a particular hardware acceleration device may indicate to the system a particular circuit board and a particular programmable IC on the circuit board. The device program binary using the HLL models may be configured to emulate any of a variety of different types of hardware acceleration devices. The attributes of physical hardware acceleration devices such as clock frequencies, latencies and/or delays, etc. may be used to configure and modify the behavior of the device program binary through modification of the HLL models using settings of the selected hardware acceleration device for emulation.

In block 710, the system may compile the host program code into a host binary. The host binary may be a standalone executable file. In block 715, the system may optionally translate an HLL implementation of the kernel into an RTL implementation of the kernel. Appreciably, block 715 need only be performed in cases where the kernels are specified using an HLL. Kernel(s) may be specified using RTL, in which case block 715 is not required. In one arrangement, whether block 715 is performed may be specified as one of the user specified inputs received by the system in block 705.

In one aspect, block 715 may generate a hardware module that may be instantiated within the programmable IC. For example, the hardware module that is generated in RTL may be specified in a hardware description language such as VHDL, Verilog, or the like. The hardware module, for example, if processed through a design flow involving synthesis, placement, and routing, may be instantiated (i.e., implemented) within the OCL region of the programmable IC.

In block 720, the system may generate an RTL simulator as the device program binary. As noted, the RTL simulator may be a binary file. In one arrangement, the system may compile the RTL implementation of the kernel using a particular hardware description language (HDL) simulation and/or development environment to generate an executable, i.e., the RTL simulator. The particular HDL tool used may be specified as one of the user specified inputs received in block 705. In one example, the HDL simulation environment may be an interpreted-code simulator that uses the RTL description(s) as data that may be included in and used by the RTL simulator. It should be appreciated that the resulting RTL simulator, when executed, performs RTL emulation of the kernel. Execution of the RTL simulator emulates operation of the hardware accelerated kernel(s). The particular HDL tool that is specified may include standard mechanisms for calling compiled HLL program code such as the compiled HLL models of the static circuitry of the programmable IC.

In block 725, the system may compile the HLL models of the static circuitry into the static circuitry binary. In block 730, the system may optionally combine the device program binary and static circuitry binary into a package file. In one arrangement, the system may include metadata within the package file that indicates that the binary included therein is intended, or configured, for emulation as opposed to a binary that includes one or more configuration bitstreams. In another arrangement, the metadata may be written as part of the binary, whether a device program binary or a hardware binary. In any case, the metadata may specify either emulation or hardware acceleration as the purpose for a given binary.

In still another arrangement, the system may generate a script for executing the device program binary. Execution of the script causes the system (i.e., the system that executes the script) to launch or execute the RTL simulator. The script may be stored within the package file with the device program binary and the static circuitry binary. It should be appreciated, however, that in another arrangement, a script may not be used and/or needed. For example, the emulation driver used by the host binary may be programmed to load the RTL simulator without the aid of a script.

In one arrangement, the device program binary may be referred to as an "XCLBIN" file. The device program binary may be used as an OpenCL binary program. In one aspect, the XCLBIN also may be used to implement real hardware that hardware accelerates program code in a hardware acceleration device or may be used for emulation as described herein. The OpenCL runtime used by the host binary at runtime may be configured to differentiate between XCLBINs configured for emulation and XCLBINs configured for actual hardware acceleration. For example, the OpenCL runtime may be configured or programmed to differentiate between two binary files such as a device program binary for emulation and a hardware binary that includes configuration bitstreams for loading in a programmable IC for actual hardware acceleration.

It should be appreciated, however, that each XCLBIN, whether configured for emulating hardware and/or implementing an actual hardware accelerator, is specific to a particular hardware acceleration device. As such, the XCLBIN that is configured for emulation of one particular hardware acceleration device may not be used to emulate another, different hardware acceleration device.

If additional device program binaries are to be generated, method 700 may be repeated as may be required to generate further device program binaries. It should be appreciated, however, that compiling the host program code need not be performed for each iteration when generating additional device program binaries for emulation.

Figure 8:
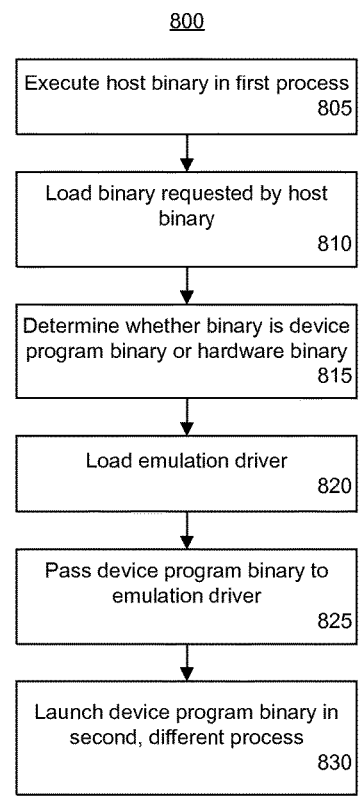
FIG. 8 is a flow chart illustrating another exemplary method of emulating an application that uses hardware acceleration.

FIG. 8 is a flow chart illustrating another exemplary method 800 of emulating an application that uses hardware acceleration. Method 800 illustrates "runtime" operations. More particularly, method 800 illustrates operations that may be performed by a data processing system (system) at runtime of emulation to emulate execution of an application that uses hardware acceleration.

In block 805, the system begins executing the host binary in a first process of the system. In block 810, the system may load a binary. The binary may be one that is requested by the host binary. For example, the requested binary may include one or more kernels requested for execution by the host binary. The binary may be a hardware binary or a device program binary.

In one arrangement, an OpenCL runtime may load the binary as one that is a binary implementation of a kernel that the host binary wishes to execute. For example, the OpenCL runtime may load the XCLBIN file. The OpenCL runtime may be provided by the hardware accelerator provider (e.g., the provider of the circuit board and/or the programmable IC) as a library that may be used by and/or included within the host binary. As such, the OpenCL runtime may execute within the first process with the host binary.

In block 815, the system may determine whether the binary for the kernel(s) requested by the host binary is configured for emulation, i.e., is a device program binary, or is configured for hardware acceleration, i.e., is a hardware binary that includes a configuration bitstream. In either case, the binary may be for a first kernel. In one arrangement, the OpenCL runtime may determine that the binary is configured for emulation. For example, the OpenCL runtime may read the metadata that may be stored within a package file including the device program binary or other binary or stored as part of the device program binary or other binary. The OpenCL runtime may be configured to read the metadata to determine whether the binary is a device program binary or a hardware binary as described from the metadata.

In block 820, responsive to determining that the binary is a device program binary, the system may load an emulation driver. For example, the OpenCL runtime may load the emulation driver. The particular driver that is selected and loaded by the OpenCL runtime may be one that is associated, or paired, with the binary of block 810. In this case, since the binary is a device program binary, the driver is an emulation driver. In the event the binary is a hardware binary, the driver is a hardware acceleration device driver. The OpenCL runtime may select the emulation driver from a plurality of available drivers, where the available drivers may include one or more emulation drivers and/or one or more hardware acceleration drivers. As noted, each driver may be associated with a particular binary or binaries.

In one arrangement, the emulation driver may be implemented like any other hardware acceleration driver in that the emulation driver may implement a standard set of APIs. The APIs may be used by the host binary and/or the OpenCL runtime. The APIs are not specific to emulation. For example, the same APIs may be used for the emulation driver and an actual hardware acceleration driver that may be used by the host binary for communicating with an actual hardware acceleration device. In this regard, the host binary may execute as is normal without being aware that it is communicating with an emulation target as opposed to an actual hardware acceleration device. The OpenCL runtime, not the host binary, may recognize that emulation is performed at least for the device program binary.

In block 825, the host binary may pass the device program binary to the emulation driver. The host binary may pass the device program binary to the emulation driver using a standard API. In one arrangement, the host binary may pass the device program binary responsive to attempting to execute the particular kernel designated for hardware acceleration that is being emulated by the device program binary.

In block 830, the emulation driver may launch or execute the RTL simulator of the device program binary in a second, different process. In one example, the emulation driver may extract the script from the device program binary or package file as the case may be. The emulation driver may execute the script, which launches, or initiates execution of the RTL simulator. In another example, the emulation driver may execute the RTL simulator without the use of a script as previously noted. The RTL simulator may be launched or executed and may execute in a second, different process of the system. As such, the host binary and the RTL simulator (the device program binary) execute concurrently in different processes.

The device program binary may load and/or execute the static circuitry binary as may be required during emulation. As noted, the static circuitry binary may be a dynamic link library file or files. The static circuitry binary may execute in the same process as the device program binary.

As part of conducting emulation, the static circuitry binary may generate one or more HLL transactions. The HLL transactions may be translated into RTL signals and provided to the RTL simulator. Further, the RTL simulator may generate RTL signals. The RTL signals may be translated to HLL transactions and provided to the static circuitry model(s).

Further device program binaries may be loaded as may be required as illustrated in FIG. 6. For example, responsive to determining that a further or second device program binary is configured for emulating hardware acceleration of a second kernel, the OpenCL runtime may load a second emulation driver for the host binary. A further, or second, RTL simulator for the second kernel may be executed in a further, e.g., a third process of the computing system. In another aspect, the second RTL simulator may be executed in the same process, i.e., the second process, in which the first RTL simulator is executed. Executing the second RTL simulator (e.g., second device program binary) in the third process provides additional isolation from the other device program binaries. The host binary may communicate with the first RTL simulator through the first emulation driver concurrently with communicating with the second RTL simulator through the second emulation driver. As also noted, the host binary may communicate with a hardware acceleration device using a hardware acceleration device driver concurrently with communicating with the RTL simulator(s) through the emulation driver(s).

In one arrangement, the host binary may create a unique identifier (ID) that may be provided to the emulation driver. The emulation driver and the device program binary may use the unique ID to communicate. The unique ID may be changed based on the type of communication channel used. For example, the unique ID may be changed according to whether file based sockets, TCPIP sockets, or the like are used. Use of the unique ID allows the emulation driver to communicate with two or more independent device program binarys concurrently.

With the RTL simulator executing, the emulation driver may communicate with the RTL simulator using IPC through specialized communication APIs. When the host binary is finished using, or accessing, a particular kernel (e.g., the device program binary), the host binary may call an API of the emulation driver to release the RTL simulator. The emulation driver may shut down or otherwise terminate execution of the RTL simulator and/or unload the device program binary from execution memory. Execution of other device program binaries and/or usage of other hardware accelerators may continue uninterrupted. Subsequently, the host binary may load another device program binary, e.g., another XCLBIN, corresponding to another hardware acceleration device as may be needed for emulation purposes.

In another arrangement, one or more of the callback APIs of the emulation driver may be called by the OpenCL runtime at a regular interval during emulation. For example, an API for pinging, or determining, the status of the device program binary, reading back profiling information, or the like may be called by the OpenCL runtime at regular intervals. Since execution of the device program binary (e.g., an emulation target) may be significantly slower than executing on an actual hardware acceleration device, an execution ratio between the device program binary (emulation) and the physical hardware acceleration device being emulated may be determined. As an illustrative example, an execution ratio is 50 indicates that the device program binary operates at $\frac{1}{50}^{th}$ the speed of an actual hardware accelerator device. Accordingly, in only 1 out of 50 instances of invoking the callback function is the callback function actually executed. Thus, once out of every 50 periodical HAL driver callbacks are actually executed. In the other 49 instances, the emulation driver function call may return immediately with cached results from the previous execution of that function call.

In another arrangement, the OpenCL runtime may monitor the speed of emulation. The OpenCL runtime may adjust and/or recalculate the ratio of emulation speed to speed of actual hardware acceleration device operation (which may be stored as a fixed parameter) as emulation continues using the newly determined speed of emulation. In this manner, the OpenCL runtime may dynamically adjust the execution ratio thereby changing the frequency of implemented callbacks using the different ratios.

In another arrangement, the device program binary may be configured to remove or minimize the notion of latencies. For example, the static circuitry binary may allow a user to specify one or more latency or delay settings. Removing, or zeroing out, the latencies does not affect the functional correctness of the static circuitry binary since the protocol accuracy is still preserved between different modeled circuit blocks of the static circuitry. The algorithm to calculate latency for a circuit block, for example, may be separate from the usage of those latencies during emulation.

In one aspect, the configuration of latencies may be controlled through a configuration file, environment variables, or the like. Thus, a user may switch from an emulation of the static circuitry that uses latencies to a purely functional and untimed emulation for the static circuitry thereby significantly speeding up the execution speed. For purposes of illustration, in early stages of emulation, a user may be concerned with the correct compilation of code. As the development progresses, the user may wish to reduce and/or remove latencies of one or more different models, e.g., the interconnect models. The user may still emulate functionality and control latency on an individual HLL model basis. For example, the user may control latencies of each of the interconnect models, PCIe DMA model, device memory model, and/or performance models independently. Execution of one or more models during emulation may be sped up by reducing latency of such models while keeping latencies in place for one or more other models of interest. Changing latencies may also aid in accounting for emulating circuitry of the circuit board. For example, a larger latency for the PCIe DMA model may account for latency in the circuitry of the circuit board in addition to static circuitry in the programmable IC.

In another arrangement, cross triggering between the host binary and the device program binary may be performed. For example, one or more break points may be set in the host program code and/or in the kernel. The RTL simulator may be executed in an interactive mode that provides visibility of operation to the user. If a break point is set within the host program code, the OpenCL runtime may, upon encountering the break point, communicate the break point to the emulation driver. Responsive to the communication, the emulation driver may halt execution of a simulation engine of the RTL simulator through IPC. The user may then query the state of device program binary.

Similarly, a break point may be set in the RTL implementation of the kernel. The break point may be set directly in the RTL simulator using an interactive shell and/or graphical user interface. As the RTL simulator execution halts responsive to encountering the break point, execution of the host binary is also halted as the next attempted communication from the host binary will not receive a response from the device program binary while halted. The user may then determine the circumstances that a particular part of the hardware acceleration device (e.g., a circuit block modeled by the HLL models) is exercised.

Figure 9:
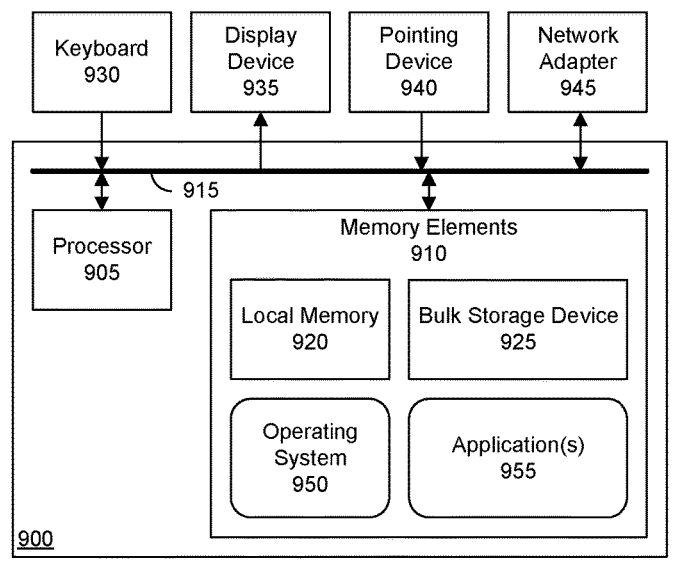
FIG. 9 is a block diagram illustrating an exemplary data processing system.

FIG. 9 is a block diagram illustrating an exemplary data processing system (system) 900. As pictured, system 900 includes at least one processor, e.g., a central processing unit (CPU), 905 coupled to memory elements 910 through a system bus 915 or other suitable circuitry. System 900 stores computer readable program instructions (also referred to as "program code") within memory elements 910. Memory elements 910 may be considered an example of computer readable storage media. Processor 905 executes the program code accessed from memory elements 910 via system bus 915.

Memory elements 910 may include one or more physical memory devices such as, for example, a local memory 920 and one or more bulk storage devices 925. System 900 may also include one or more cache memories (not shown). I/O devices such as a keyboard 930, a display device 935, a pointing device 940, and one or more network adapters 945 may be coupled to system 900. The I/O devices may be coupled to system 900 either directly or through intervening I/O controllers. In some cases, one or more of the I/O devices may be combined as in the case where a touchscreen is used as display device 935. In that case, display device 935 may also implement keyboard 930 and pointing device 940. Network adapter 945 may be used to couple system 900 to other systems, computer systems, remote printers, and/or remote storage devices through intervening private or public networks. Depending upon the particular implementation of system 900, the specific type of network adapter, or network adapters as the case may be, will vary.

As pictured in FIG. 9, memory elements 910 may store an operating system 950 and one or more applications 955. In one aspect, application 955 may be an EDA application. In another aspect, application 955 may be one or more compilers. Operating system 950 and application 955, being implemented in the form of executable program code, may be executed by system 900 and, in particular, by processor 905. As such, operating system 950 and application 955 may be considered an integrated part of system 900. Operating system 950, application 955, and any data items used, generated, and/or operated upon by system 900 are functional data structures that impart functionality when utilized by system 900.

In one aspect, system 900 may be a computer or other device that is suitable for storing and/or executing program code. System 900 may represent any of a variety of computer systems and/or devices that include a processor and memory and that are capable of performing the operations described within this disclosure. In some cases, the particular computer system and/or device may include fewer components or more components than described. System 900 may be implemented as a single system as shown or as a plurality of networked or interconnected systems each having an architecture the same as, or similar to, that of system 900.

System 900 may be configured to perform the various compile time and/or runtime operations described herein. For example, system 900 may be used to implement the method of FIG. 7 and/or the method of FIG. 8.

The inventive arrangements disclosed within this specification may be utilized in other instances of hardware acceleration. For example, in some cases, program code may be executed by a processor within a system-on-chip (SOC) type of IC that also includes programmable circuitry. Some FPGAs, for example, may include programmable circuitry and a processor capable of executing program code. In that case, the "heterogeneous computing platform" may be the SOC itself. The host program code may execute in the processor of the SOC. Hardware accelerated kernels may be implemented in the programmable circuitry of the SOC. The static circuitry that is modeled may be entirely within the SOC and model interfaces with the processor. In such an example, the application may be emulated as described herein, where the device program binary represents the hardware accelerated kernels and interfaces with the processor of the SOC.

For purposes of explanation, specific nomenclature is set forth to provide a thorough understanding of the various inventive concepts disclosed herein. The terminology used herein, however, is for the purpose of describing particular aspects of the inventive arrangements only and is not intended to be limiting.

As defined herein, the singular forms "a," "an," and "the" are intended to include the plural forms as well, unless the context clearly indicates otherwise. As defined herein, the term "another" means at least a second or more. As defined herein, the terms "at least one," "one or more," and "and/or," are open-ended expressions that are both conjunctive and disjunctive in operation unless explicitly stated otherwise. For example, each of the expressions "at least one of A, B and C," "at least one of A, B, or C," "one or more of A, B, and C," "one or more of A, B, or C," and "A, B, and/or C" means A alone, B alone, C alone, A and B together, A and C together, B and C together, or A, B and C together. As defined herein, the term "automatically" means without user intervention.

As defined herein, the term "computer readable storage medium" means a storage medium that contains or stores program code for use by or in connection with an instruction execution system, apparatus, or device. As defined herein, a "computer readable storage medium" is not a transitory, propagating signal per se. A computer readable storage medium may be, but is not limited to, an electronic storage device, a magnetic storage device, an optical storage device, an electromagnetic storage device, a semiconductor storage device, or any suitable combination of the foregoing. Memory elements, as described herein, are examples of a computer readable storage medium. A non-exhaustive list of more specific examples of a computer readable storage medium may include: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing.

As defined herein, the term "coupled" means connected, whether directly without any intervening elements or indirectly with one or more intervening elements, unless otherwise indicated. Two elements may be coupled mechanically, electrically, or communicatively linked through a communication channel, pathway, network, or system. As defined herein, the terms "includes," "including," "comprises," and/or "comprising," specify the presence of stated features, integers, steps, operations, elements, and/or components, but do not preclude the presence or addition of one or more other features, integers, steps, operations, elements, components, and/or groups thereof. As defined herein, the term "output" means storing in physical memory elements, e.g., devices, writing to display or other peripheral output device, sending or transmitting to another system, exporting, or the like. As defined herein, the term "plurality" means two or more than two.

As defined herein, the term "executable operation" or "operation" is a task performed by a data processing system or a processor within a data processing system unless the context indicates otherwise. Examples of executable operations include, but are not limited to, "processing," "computing," "calculating," "determining," "displaying," "comparing," or the like. In this regard, operations refer to actions and/or processes of the data processing system, e.g., a computer system, or similar electronic computing device, that manipulates and transforms data represented as physical (electronic) quantities within the computer system's registers and/or memories into other data similarly represented as physical quantities within the computer system memories and/or registers or other such information storage, transmission or display devices.

As defined herein, the term "hardware description language" or "HDL" refers to a computer-language that facilitates the documentation, design, and manufacturing of a digital system, such as an integrated circuit. An HDL combines program verification techniques with expert system design methodologies. Using an HDL, for example, a user can design and specify an electronic circuit, describe the operation of the circuit, and create tests to verify operation of the circuit. In general, an HDL includes standard, text-based expressions of the spatial and temporal structure and behavior of the electronic system being modeled. HDL syntax and semantics include explicit notations for expressing concurrency. In contrast to most high level programming languages, an HDL also includes an explicit notion of time, which is a primary attribute of a digital system. An HDL description of circuitry is one example of a register transfer level (RTL) description of the circuitry.

As defined herein, the term "high level programming language" means a programming language, or set of instructions, used to program a data processing system where the instructions have a strong abstraction from the details of the data processing system, e.g., machine language. For example, a high level programming language may automate or hide aspects of operation of the data processing system such as memory management. The amount of abstraction typically defines how "high level" the programming language is. Using a high level programming language frees the user from dealing with registers, memory addresses, and other low level features of the data processing system upon which the high level programming language will execute. In this regard, a high level programming language includes little or no instructions that translate directly, on a one-to-one basis, into a native opcode of a data processing system. Examples of high level programming languages include, but are not limited to, C, C++, SystemC, OpenCL, Matlab, or the like.

As defined herein, the term "if" means "when" or "upon" or "in response to" or "responsive to," depending upon the context. Thus, the phrase "if it is determined" or "if [a stated condition or event] is detected" may be construed to mean "upon determining" or "in response to determining" or "upon detecting [the stated condition or event]" or "in response to detecting [the stated condition or event]" or "responsive to detecting [the stated condition or event]" depending on the context. As defined herein, the term "responsive to" means responding or reacting readily to an action or event. Thus, if a second action is performed "responsive to" a first action, there is a causal relationship between an occurrence of the first action and an occurrence of the second action. The term "responsive to" indicates the causal relationship.

As defined herein, the term "processor" means at least one hardware circuit configured to carry out instructions contained in program code. The hardware circuit may be an integrated circuit.

As defined herein, the term "real time" means a level of processing responsiveness that a user or system senses as sufficiently immediate for a particular process or determination to be made, or that enables the processor to keep up with some external process. As defined herein, the term "user" means a human being. The terms first, second, etc. may be used herein to describe various elements. These elements should not be limited by these terms, as these terms are only used to distinguish one element from another unless stated otherwise or the context clearly indicates otherwise.

In some instances, the term "signal" may be used within this disclosure to describe physical structures such as terminals, pins, signal lines, wires. In other instances, the term "signal" may be used to refer to particular values specified by a wire. The term "signal" may refer to the conveyance of a single bit, e.g., a single wire, or the conveyance of multiple parallel bits through multiple parallel wires. Further, each signal may represent bi-directional communication between two, or more, components connected by the signal.

As used herein, the terms "an aspect," another aspect," "an arrangement," "another arrangement," or similar language mean that a particular feature, structure, or characteristic described in connection with the aspect and/or arrangement is included in at least one exemplary implementation described within this disclosure. Thus, appearances of the phrases "in one arrangement," "in an arrangement," "in one aspect," "in another aspect" and similar language throughout this disclosure may, but do not necessarily, all refer to the same arrangement.

A computer program product may include a computer readable storage medium (or media) having computer readable program instructions thereon for causing a processor to carry out aspects of the inventive arrangements described herein. Computer readable program instructions described herein may be downloaded to respective computing/processing devices from a computer readable storage medium or to an external computer or external storage device via a network, for example, the Internet, a LAN, a WAN and/or a wireless network. The network may include copper transmission cables, optical transmission fibers, wireless transmission, routers, firewalls, switches, gateway computers and/or edge devices including edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations for the inventive arrangements described herein may be assembler instructions, instruction-set-architecture (ISA) instructions, machine instructions, machine dependent instructions, microcode, firmware instructions, state-setting data, or either source code or object code written in any combination of one or more programming languages, including an object oriented programming language and/or procedural programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a LAN or a WAN, or the connection may be made to an external computer (for example, through the Internet using an Internet Service Provider). In some cases, electronic circuitry including, for example, programmable logic circuitry, an FPGA, or a PLA may execute the computer readable program instructions by utilizing state information of the computer readable program instructions to personalize the electronic circuitry, in order to perform aspects of the inventive arrangements described herein.

Certain aspects of the inventive arrangements are described herein with reference to flowchart illustrations and/or block diagrams of methods, apparatus (systems), and computer program products. It will be understood that each block of the flowchart illustrations and/or block diagrams, and combinations of blocks in the flowchart illustrations and/or block diagrams, may be implemented by computer readable program instructions, e.g., program code.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the operations specified in the flowchart and/or block diagram block or blocks.

The computer readable program instructions may also be loaded onto a computer, other programmable data processing apparatus, or other device to cause a series of operations to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various aspects of the inventive arrangements. In this regard, each block in the flowchart or block diagrams may represent a module, segment, or portion of instructions, which comprises one or more executable instructions for implementing the specified operations.

In some alternative implementations, the operations noted in the blocks may occur out of the order noted in the figures. For example, two blocks shown in succession may be executed substantially concurrently, or the blocks may sometimes be executed in the reverse order, depending upon the functionality involved. In other examples, blocks may be performed generally in increasing numeric order while in still other examples, one or more blocks may be performed in varying order with the results being stored and utilized in subsequent or other blocks that do not immediately follow. It will also be noted that each block of the block diagrams and/or flowchart illustration, and combinations of blocks in the block diagrams and/or flowchart illustration, may be implemented by special purpose hardware-based systems that perform the specified functions or acts or carry out combinations of special purpose hardware and computer instructions.

The corresponding structures, materials, acts, and equivalents of all means or step plus function elements that may be found in the claims below are intended to include any structure, material, or act for performing the function in combination with other claimed elements as specifically claimed.

A method of emulating a heterogeneous application having a kernel designated for hardware acceleration may include compiling, using a processor, host program code into a host binary configured to execute in a first process of a computing system and generating, using the processor, a device program binary implementing an RTL simulator using the kernel. The device program binary may be configured to execute in a second, different process of the computing system. The method may include compiling, using the processor, an HLL model of static circuitry of a programmable IC that couples to a circuit implementation of the kernel into a static circuitry binary. The static circuitry binary may be used by the device program binary during emulation.

Generating the device program binary may include translating an HLL implementation of the kernel to an RTL implementation of the kernel.

The method may include combining the static circuitry binary with the device program binary within a package file.

The method may also include generating metadata indicating whether the device program binary is configured for emulation.

In one aspect, the host binary and the device program binary may be configured to communicate during emulation using IPC.

In another aspect, the static circuitry binary may be implemented as a dynamic link library file.

In a further aspect, the static circuitry binary may use HLL transactions; the RTL simulator may use RTL signals; and the static circuitry binary may be configured to translate between the HLL transactions and the RTL signals.

A system for emulating a heterogeneous application having a kernel designated for hardware acceleration may include a processor programmed to initiate executable operations. The executable operations may include compiling host program code into a host binary configured to execute in a first process of a computing system and generating a device program binary implementing an RTL simulator using the kernel. The device program binary may be configured to execute in a second, different process of the computing system. The executable operations may include compiling an HLL model of static circuitry of a programmable IC that couples to a circuit implementation of the kernel into a static circuitry binary. The static circuitry binary may be used by the device program binary during emulation.

Generating the device program binary may include translating an HLL implementation of the kernel to an RTL implementation of the kernel.

The processor may be further programmed to initiate executable operations including combining the static circuitry binary and the device program binary within a package file.

The host binary and the device program binary may be configured to communicate during emulation using IPC.

In one aspect, the static circuitry binary may be implemented as a dynamic link library file.

In another aspect, the static circuitry binary may use HLL transactions; the RTL simulator may use RTL signals; and the static circuitry binary may be configured to translate between the HLL transactions and the RTL signals.

A method of emulating a heterogeneous application with hardware accelerated program code may include executing, using a processor of a computing system, a host binary within a first process of the computing system and, responsive to determining that a first device program binary is configured for emulating hardware acceleration of a first kernel, loading, using the processor, a first emulation driver. In a second and different process of the computing system, the first device program binary for the first kernel may be executed. The first device program binary may implement a first RTL simulator for the first kernel. The host binary may communicate with the first RTL simulator through the first emulation driver using inter-process communication.

The first RTL simulator may be configured to invoke a static circuitry binary compiled from HLL models of static circuitry of a programmable IC. The static circuitry may be configured to couple to a hardware implementation of the first kernel.

The method may include generating, within the static circuitry binary, an HLL transaction, translating the HLL transaction to RTL signals, and providing the RTL signals to the first RTL simulator.

The method may include generating, within the RTL simulator, RTL signals, providing the RTL signals to the static circuitry binary, and translating the RTL signals to an HLL transaction.

In one aspect, the first device program binary may emulate a hardware implementation of the first kernel in a programmable IC. The method may include emulating reconfiguration of the programmable IC by unloading the first device program binary and loading and executing a second device program binary implementing a second RTL simulator that emulates a hardware implementation of a second kernel within the programmable IC.

In another aspect, the method may include, responsive to determining that a second device program binary is configured for emulating hardware acceleration of a second kernel, loading a second emulation driver. The second device program binary may implement a second RTL simulator. The method may include executing the second device program binary. The host binary may communicate with the first device program binary through the first emulation driver concurrently with communicating with the second device program binary through the second emulation driver.

The host binary may communicate with a hardware acceleration device using a hardware acceleration device driver concurrently with communicating with the first device program binary through the emulation driver.

The description of the inventive arrangements provided herein is for purposes of illustration and is not intended to be exhaustive or limited to the form and examples disclosed. The terminology used herein was chosen to explain the principles of the inventive arrangements, the practical application or technical improvement over technologies found in the marketplace, and/or to enable others of ordinary skill in the art to understand the embodiments disclosed herein. Modifications and variations may be apparent to those of ordinary skill in the art without departing from the scope and spirit of the described inventive arrangements. Accordingly, reference should be made to the following claims, rather than to the foregoing disclosure, as indicating the scope of such features and implementations.

What is claimed is:

1. A method of emulating a heterogeneous application having a kernel designated for hardware acceleration, the method comprising:
    compiling, using a processor, host program code into a host binary configured to execute in a first process of a computing system;
    generating, using the processor, a device program binary implementing a register transfer level simulator configured to interpret the kernel, wherein the kernel is specified as a register transfer level implementation, and the device program binary is configured to execute in a second, different process of the computing system; and
    compiling, using the processor, a programming language model of static circuitry of a programmable integrated circuit that couples to a circuit implementation of the kernel into a static circuitry binary;
    wherein the static circuitry binary is used by the register transfer level simulator during emulation; and
    executing, using the processor, the host binary in the first process and the device program binary and the static circuitry binary in the second, different process.

2. The method of claim 1, wherein generating the device program binary comprises:
    translating a programming language implementation of the kernel to the register transfer level implementation of the kernel.

3. The method of claim 1, further comprising:
    combining the static circuitry binary and the device program binary within a package file.

4. The method of claim 1, further comprising:
    generating metadata indicating whether the device program binary is configured for emulation.

5. The method of claim 3, wherein the host binary and the device program binary are configured to communicate during emulation using inter-process communication.

6. The method of claim 1, wherein the static circuitry binary is implemented as a dynamic link library file.

7. The method of claim 1, wherein:
    the static circuitry binary uses programming language transactions;
    the register transfer level simulator uses register transfer level signals;
    the static circuitry binary is configured to translate between the programming language transactions and the register transfer level signals.

8. A system for emulating a heterogeneous application having a kernel designated for hardware acceleration, comprising:
    a processor programmed to initiate executable operations comprising:
    compiling host program code into a host binary configured to execute in a first process of a computing system;
    generating a device program binary implementing a register transfer level simulator configured to interpret using the kernel, wherein the kernel is specified as a register transfer level implementation, and the device program binary is configured to execute in a second, different process of the computing system;
    compiling a programming language model of static circuitry of a programmable integrated circuit that couples to a circuit implementation of the kernel into a static circuitry binary;
    wherein the static circuitry binary is used by the register transfer level simulator during emulation; and
    executing, using the processor, the host binary in the first process and the device program binary and the static circuitry binary in the second, different process.

9. The system of claim 8, wherein generating the device program binary comprises:
    translating programming language implementation of the kernel to the register transfer level implementation of the kernel.

10. The system of claim 8, wherein the processor is further programmed to initiate executable operations comprising:

combining the static circuitry binary and the device program binary into a package file.

11. The system of claim 10, wherein the host binary and the device program binary are configured to communicate during emulation using inter-process communication.

12. The system of claim 8, wherein the static circuitry binary is implemented as a dynamic link library file.

13. The system of claim 8, wherein:
the static circuitry binary uses programming language transactions;
the register transfer level simulator uses register transfer level signals;
the static circuitry binary is configured to translate between the programming language transactions and the register transfer level signals.

14. A method of emulating a heterogeneous application with hardware accelerated program code, comprising:
executing, using a processor of a computing system, a host binary within a first process of the computing system;
responsive to determining that a first device program binary is configured for emulating hardware acceleration of a first kernel, loading, using the processor, a first emulation driver; and
in a second and different process of the computing system, executing the first device program binary for the first kernel, wherein the first device program binary implements a first register transfer level simulator for the first kernel; and
the host binary communicating with the first device program binary through the first emulation driver using inter-process communication.

15. The method of claim 14, wherein the first register transfer level simulator is configured to invoke a static circuitry binary compiled from programming language models of static circuitry of a programmable integrated circuit, wherein the static circuitry is configured to couple to a hardware implementation of the first kernel.

16. The method of claim 15, further comprising:
generating, within the static circuitry binary, a programming language transaction;
translating the programming language transaction into register transfer level signals; and
providing the register transfer level signals to the first register transfer level simulator.

17. The method of claim 15, further comprising:
generating, within the first register transfer level simulator, register transfer level signals;
providing the register transfer level signals to the static circuitry binary; and
translating the register transfer level signals to a programming language transaction.

18. The method of claim 15, wherein the first device program binary emulates a hardware implementation of the first kernel in a programmable integrated circuit, the method further comprising:
emulating reconfiguration of the programmable integrated circuity by unloading the first device program binary and loading and executing a second device program binary implementing a second register transfer level simulator that emulates a hardware implementation of a second kernel within the programmable integrated circuit.

19. The method of claim 15, further comprising:
responsive to determining that a second device program binary is configured for emulating hardware acceleration of a second kernel, loading a second emulation driver, wherein the second device program binary implements a second register transfer level simulator; and
executing the second device program binary;
wherein the host binary communicates with the first device program binary through the first emulation driver concurrently with communicating with the second device program binary through the second emulation driver.

20. The method of claim 15, wherein the host binary communicates with a hardware acceleration device using a hardware acceleration device driver concurrently with communicating with the first device program binary through the emulation driver.

* * * * *